(12) United States Patent
Kwon

(10) Patent No.: US 11,545,440 B2
(45) Date of Patent: Jan. 3, 2023

(54) SEMICONDUCTOR PACKAGE

(71) Applicant: Samsung Electronics Co., Ltd., Suwon-si (KR)

(72) Inventor: Yonghwan Kwon, Suwon-si (KR)

(73) Assignee: Samsung Electronice Co., Ltd., Suwon-si (KR)

( * ) Notice: Subject to any disclaimer, the term of this patent is extended or adjusted under 35 U.S.C. 154(b) by 124 days.

(21) Appl. No.: 17/019,519

(22) Filed: Sep. 14, 2020

(65) Prior Publication Data
US 2021/0183785 A1 Jun. 17, 2021

(30) Foreign Application Priority Data
Dec. 17, 2019 (KR) .................... 10-2019-0168552

(51) Int. Cl.
*H01L 23/538* (2006.01)
*H01L 23/31* (2006.01)
*H01L 25/10* (2006.01)
*H01L 23/00* (2006.01)

(52) U.S. Cl.
CPC ...... *H01L 23/5389* (2013.01); *H01L 23/3128* (2013.01); *H01L 23/5383* (2013.01); *H01L 23/5386* (2013.01); *H01L 24/20* (2013.01); *H01L 25/105* (2013.01); *H01L 2224/214* (2013.01); *H01L 2225/1035* (2013.01); *H01L 2225/1058* (2013.01)

(58) Field of Classification Search
CPC ............ H01L 23/5389; H01L 23/3128; H01L 23/5383; H01L 23/5386; H01L 24/20; H01L 25/105; H01L 2224/214; H01L 2225/1035; H01L 2225/1058
See application file for complete search history.

(56) References Cited

U.S. PATENT DOCUMENTS

| 8,008,770 | B2 | 8/2011 | Lin et al. |
| 8,212,362 | B2 | 7/2012 | Watanabe |
| 9,786,617 | B2 | 10/2017 | Liu et al. |
| 9,905,518 | B2 | 2/2018 | Okumura |
| 10,157,874 | B2 | 12/2018 | Tsai et al. |
| 10,165,682 | B2 | 12/2018 | Hsieh et al. |
| 10,290,584 | B2 | 5/2019 | Hsieh et al. |
| 10,700,031 | B2 * | 6/2020 | Yu .......................... H01L 24/04 |
| 2013/0270705 | A1 | 10/2013 | Wang et al. |

(Continued)

*Primary Examiner* — Fernando L Toledo
*Assistant Examiner* — Neil R Prasad
(74) *Attorney, Agent, or Firm* — Myers Bigel, P.A.

(57) ABSTRACT

A semiconductor package includes a redistribution substrate including a first redistribution layer, a first molding member on the redistribution substrate, a second redistribution layer on an upper surface of the first molding member and having a redistribution pad, an electrical connection pad on an upper surface of a second molding member and electrically connected to the second redistribution layer, and a passivation layer on the second molding member and having an opening exposing at least a portion of the electrical connection pad. The electrical connection pad includes a conductor layer, including a first metal, and a contact layer on the conductor layer and including a second metal. The redistribution pad includes a third metal, different from the first metal and the second metal. The portion of the electrical connection pad, exposed by the opening, has a width greater than a width of the redistribution pad.

19 Claims, 12 Drawing Sheets

(56) References Cited

U.S. PATENT DOCUMENTS

| | | |
|---|---|---|
| 2015/0214170 A1 | 7/2015 | Chen et al. |
| 2019/0131235 A1* | 5/2019 | Wang ...................... H01L 22/32 |
| 2019/0131284 A1* | 5/2019 | Jeng ........................ H01L 24/27 |
| 2020/0027837 A1* | 1/2020 | Jeng .................... H01L 23/5385 |

* cited by examiner

SEMICONDUCTOR PACKAGE

CROSS-REFERENCE TO RELATED APPLICATION

This application claims benefit of priority to Korean Patent Application No. 10-2019-0168552 filed on Dec. 17, 2019 in the Korean Intellectual Property Office, the disclosure of which is incorporated herein by reference in its entirety.

BACKGROUND

The present disclosure relates generally to semiconductor packages, and, more particularly, to semiconductor packages including a redistribution layer for making electrical connections.

While semiconductor devices may be required to process high-capacity data, the volumes thereof have gradually been reduced. Accordingly, in a package-on-package (POP) configuration, including different semiconductor coupled chips to each other, the number of electrical connection pads disposed on a backside of a lower package and the number of backside interconnection lines electrically connecting the electrical connection pads to first redistribution layers RDL have been increased. However, because the electrical connection pad is required to have an area with a standardized size, it may be difficult to reduce the area to a predetermined size or less and there may be technical limitations in decreasing a width and a space of the backside interconnection line.

SUMMARY

Example embodiments provide a semiconductor package having improved integration density and reliability through use of a second redistribution layer.

According to an example embodiment, a semiconductor package includes a redistribution substrate including a first redistribution layer, a semiconductor chip on the redistribution substrate and electrically connected to the first redistribution layer, a first molding member on the redistribution substrate and the semiconductor chip, a second redistribution layer on the first molding member and having a redistribution pad, a vertical connection structure between the redistribution substrate and the second redistribution layer and electrically connecting the first redistribution layer and the second redistribution layer to each other, a second molding member on the first molding member and at least a portion of the second redistribution layer, an electrical connection pad on an uppermost surface of the second molding member and electrically connected to the second redistribution layer, and a passivation layer on the second molding member and having an opening exposing at least a portion of the electrical connection pad. The electrical connection pad includes a conductor layer, including a first metal, and a contact layer on the conductor layer and including a second metal. The redistribution pad includes a third metal, different from the first metal and the second metal. The portion of the electrical connection pad, exposed by the opening, has a width greater than a width of the redistribution pad.

According to an example embodiment, a semiconductor package includes a redistribution substrate including a first redistribution layer, a semiconductor chip on the redistribution substrate, a first molding member on the redistribution substrate and the semiconductor chip, a second redistribution layer on the first molding member and including a redistribution pad, a vertical connection structure on the redistribution substrate and electrically connecting the first redistribution layer and the second redistribution layer to each other, a second molding member on the first molding member and covering at least a portion of the second redistribution layer, and an electrical connection structure on the second molding member and electrically connected to the redistribution pad. The electrical connection structure includes a conductor layer, including nickel (Ni), and a contact layer on an upper surface of the conductor layer and including gold (Au). The redistribution pad includes copper (Cu).

According to an example embodiment, a semiconductor package includes a redistribution substrate including a first redistribution layer, a semiconductor chip on the redistribution substrate and electrically connected to the first redistribution layer, a first molding member on the redistribution substrate and the semiconductor chip, a plurality of vertical connection structures embedded in the first molding member and electrically connected to the first redistribution layer, a second molding member including a base molding layer, on an upper surface of the first molding member, and a build-up molding layer on an upper surface of the base molding layer, a second redistribution layer on the upper surface of the base molding layer and including a plurality of redistribution pads and a plurality of redistribution patterns electrically connecting the plurality of redistribution pads and the plurality of vertical connection structures to each other, and a plurality of electrical connection structures on the second molding member and having a pad portion, protruding from the upper surface of the build-up molding layer, and a via portion in physical contact with at least one of the plurality of redistribution pads through the build-up molding layer. The plurality of electrical connection structures include a conductor layer, including nickel (Ni), and a contact layer on an upper surface of the conductor layer and including gold (Au). The plurality of redistribution pads includes a first backside redistribution pad and a second backside redistribution pad adjacent to each other. The plurality of electrical connection structures include a first backside electrical connection structure and a second backside electrical connection structure corresponding to the first backside redistribution pad and the second backside redistribution pad, respectively. The plurality of redistribution patterns extend between the first backside redistribution pad and the second backside redistribution pad, and at least a portion of the plurality of redistribution patterns vertically overlaps at least one of the first backside electrical connection structure and the second backside electrical connection structure in a cross-sectional view of the semiconductor package in which the redistribution substrate serves as a base reference plane.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
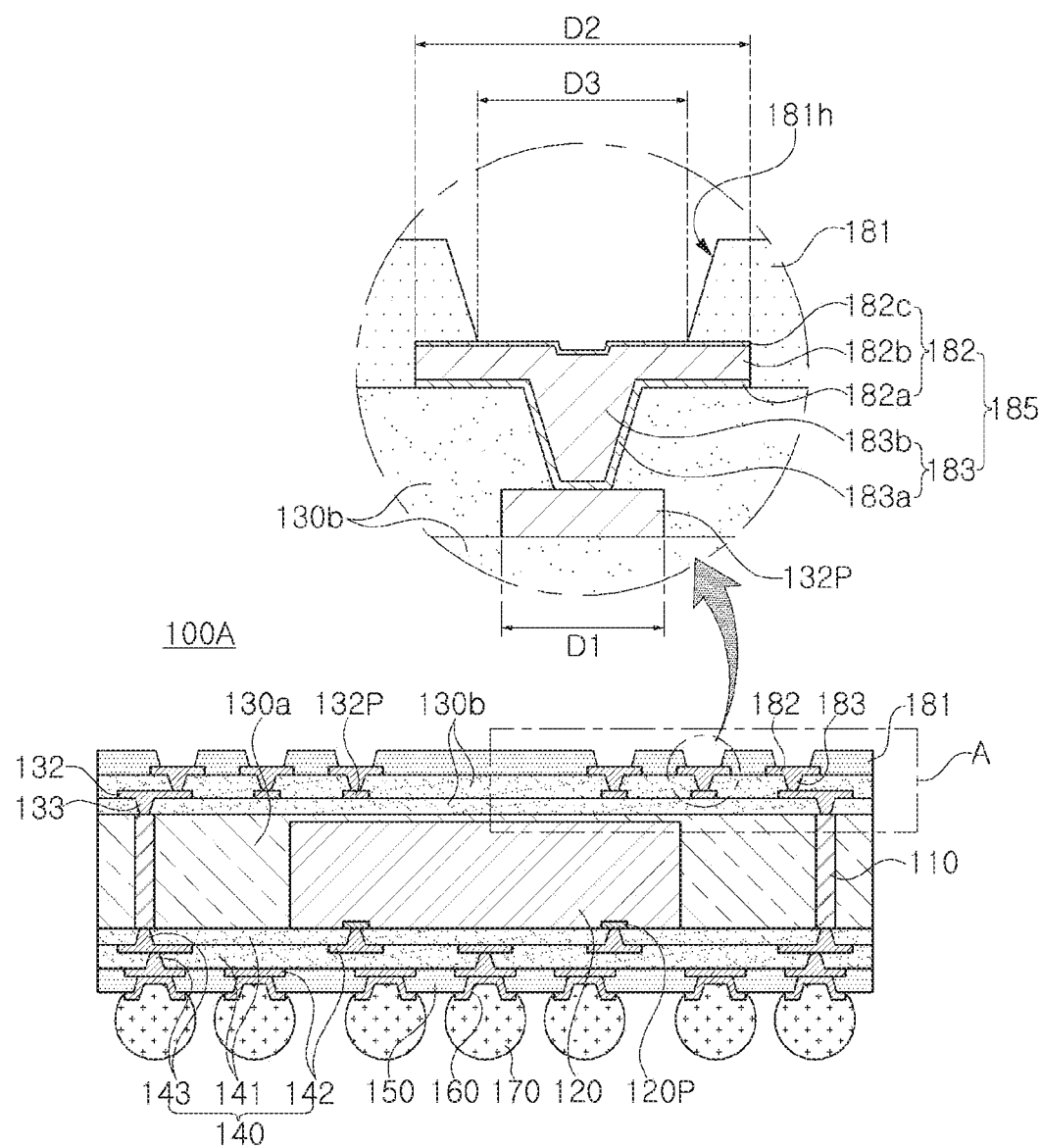
FIG. 1 is a cross-sectional view of a semiconductor package according to some example embodiments of the inventive concept.

Hereinafter, embodiments of the inventive concepts will be described in detail with reference to the accompanying drawings. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 2:
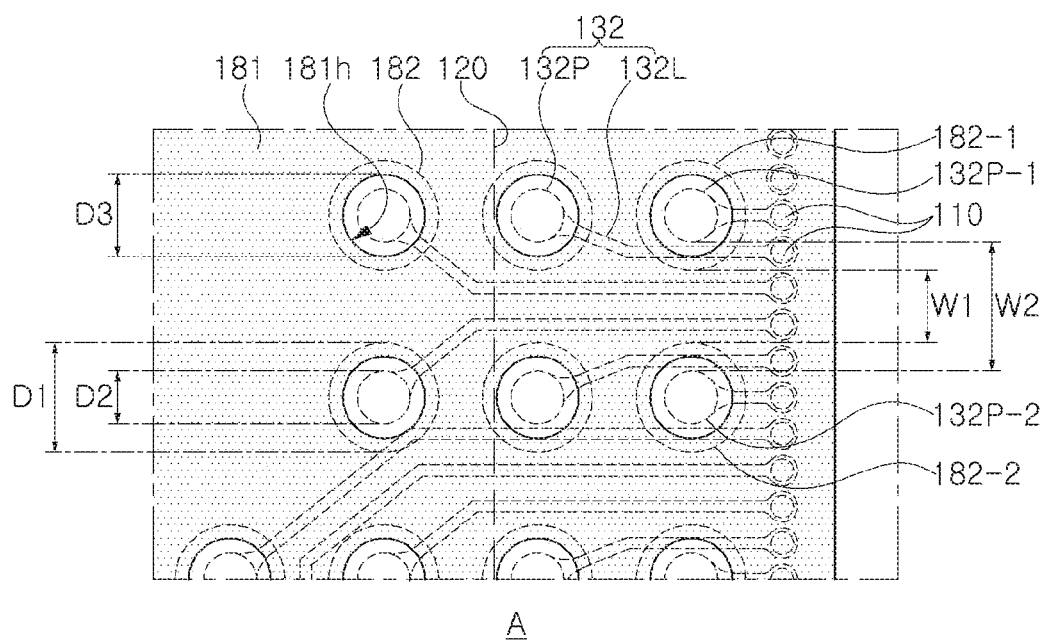
FIG. 2 is a schematic plan view illustrating elements corresponding to region "A" in the semiconductor package of FIG. 1.

FIG. 1 is a cross-sectional view of a semiconductor package 100A according to some example embodiments of the inventive concept, and FIG. 2 is a schematic plan view, illustrating elements corresponding to region "A" in the semiconductor package 100A of FIG. 1. FIG. 2 illustrates elements corresponding to region "A" when the semiconductor package 100A of FIG. 1 is viewed from above, i.e., a plan view.

Referring to FIGS. 1 and 2, the semiconductor package 100A may include a vertical connection structure 110, a semiconductor chip 120, a first molding member 130a, a second molding member 130b, a second redistribution layer 132 having a redistribution pad 132P, a redistribution substrate 140 having a first redistribution layer 142, an electrical connection structure 185 having an electrical connection pad 182 and an electrical connection via 183, and a second passivation layer 181 on and at least partially covering a portion of the electrical connection structure 185.

In example embodiments, the semiconductor package 100A may further include a first passivation layer 150 disposed on the redistribution substrate 140 to protect the first redistribution layer 142, an underbump metal 160 penetrating through the first passivation layer 150, and a connection bump 170 connected to the underbump metal 160.

The vertical connection structure 110 may be a conductive post disposed on a surface of the redistribution substrate 140 (for example, an upper surface of the redistribution substrate in FIG. 1) and electrically connecting the first redistribution layer 142 and the second redistribution layer 132 to each other through at least a portion of the first molding member 130a. The vertical connection structure 110 may include a plurality of vertical connection structures 110 disposed around the semiconductor chip 120. The vertical connection structure 110 may form an electrical path penetrating through the first molding member 130a. The conductive post may include a conductive material. The conductive post may be completely filled with a conductive material and may have, for example, a cylindrical shape or a polygonal columnar shape. A shape of the conductive post is not necessarily limited; accordingly, the conductive post may have various shapes. In FIG. 1, the vertical connection structure 110 is connected to the second redistribution layer 132 through a backside via 133. However, unlike what is illustrated in FIG. 1, the vertical connection structure 110 may be directly connected to the second redistribution layer 132 when an upper surface of the vertical connection structure 110 is disposed to be coplanar with an upper surface of the first molding member 130a by a planarization process, such as a chemical mechanical polishing (CMP) process (see FIG. 12).

The semiconductor chip 120 may have an active surface, on which connection electrodes 120P are disposed, and an inactive surface opposing the active surface. The semiconductor chip 120 may be a logic chip or a memory chip. For example, the semiconductor chip 120 may include a system large scale integration (LSI), a logic circuit, CMOS imaging sensor (CIS), a memory device such as a DRAM, an SRAM, a flash memory, a PRAM, an ReRAM, an FeRAM, an MRAM, a high bandwidth memory (HBM), a hybrid memory cubic (HMC), a microelectromechanical system (MEMS) device, or the like.

Additional connection members may be disposed between the connection electrodes 120P and the first redistribution layer 142. The connection members may include solder balls or copper pillars. For example, the semiconductor chip 120 may be mounted on the redistribution substrate 140 in a flip-chip bonding manner. In such embodiments, an underfill resin may be formed between the semiconductor chip 120 and the redistribution substrate 140 to border and/or at least partially surround the connection members.

The first molding member 130a may be disposed on the redistribution substrate 140 and may be on and at least partially cover the semiconductor chip 120. The first molding member 130a may include an insulating material, and the insulating material may be a material including an inorganic filler and an insulating resin, for example, a thermosetting resin, such as an epoxy resin, a thermoplastic resin, such as a polyimide, or a resin in which a reinforcement, such as an inorganic filler, is contained in the thermosetting resin or the thermoplastic resin, in detail, an Ajinomoto build-up film (ABF), an FR-4 resin, a bismaleimide triazine (BT) resin, a resin, or the like. In addition, the insulating material may an epoxy molding compound (EMC), a photoimageable encapsulant (PIE), or the like.

The second molding member 130b may be an insulating layer disposed on a backside of the semiconductor package 100A and a side close to a surface on which the connection electrode 120P of the semiconductor chip 120 is not disposed (the inactive surface). The second molding member 130b may be on and at least partially cover a portion of the second redistribution layer 132. The second molding member 130b may include an insulating material, and the insulating material may be a material including an inorganic filler and an insulating resin, for example, a thermosetting resin, such as an epoxy resin, a thermoplastic resin, such as a polyimide, or a resin in which a reinforcement, such as an inorganic filler, is contained in the thermosetting resin or the thermoplastic resin, in detail, an Ajinomoto build-up film (ABF), an FR-4 resin, a bismaleimide triazine (BT) resin, a resin, or the like. In addition, the insulating material may an epoxy molding compound (EMC), a photoimageable encapsulant (PIE), or the like. The second molding member 130b may be formed of the same material as the first molding member 130a or may be formed of a material different from the material of the first molding member 130a. Boundary lines separating the second molding member 130b and the first molding member 130a are shown in FIG. 1, but boundaries therebetween may not be readily apparent depending on a process used for fabrication.

The second molding member 130b may include a base molding layer (a lower molding layer) 130b, disposed to be in physical contact with an upper surface of the first molding member 130a, and a build-up molding layer (an upper molding layer) 130b disposed to be in physical contact with an upper surface of the base molding layer (the lower molding layer) 130b. The second redistribution layer 132 may be disposed on an upper surface of the base molding layer (the lower molding layer) 130b, and the build-up molding layer (the upper molding layer) 130b may be on and at least partially cover the second redistribution layer 132.

The second redistribution layer 132 may include a redistribution pad (or "a backside redistribution pad") 132P, disposed on an upper surface of the base molding layer (the lower molding layer) 130b, and a redistribution pattern (or "a backside redistribution pattern") 132L electrically connecting the redistribution pad 132P to the vertical connection structure 110. The second redistribution layer 132 may include a plurality of redistribution pads 132P and a plurality of redistribution patterns 132L connecting the plurality of redistribution pads 132P and the plurality of vertical connection structures 110 to each other. The second redistribution layer 132 may be disposed on the first molding member 130a to provide an electrical circuit to the backside of the package 100A. The second redistribution layer 132 may include a conductive material. For example, the conductive material may be copper (Cu), aluminum (Al), silver (Ag), tin (Sn), gold (Au), nickel (Ni), lead (Pb), titanium (Ti), or alloys thereof. The second redistribution layer 132 may perform various functions depending on a design thereof. For example, the second redistribution layer 132 may have a ground (GND) pattern, a power (PWR) pattern, and/or a signal (S) pattern. The second redistribution layer 132 may be formed by a plating process, and may include a seed layer and a conductor layer.

The redistribution pad 132P may be a portion, directly connected to the electrical connection structure 185, and may have a circular pad having a diameter greater than a width of the redistribution pattern 132L. However, in other embodiments of the inventive concept, a shape of the redistribution pad 132P is not necessarily limited to these examples.

The redistribution pattern 132L may be a circuit pattern formed so as to extend on the first molding member 130a and having one end connected to the redistribution pad 132P and the other end connected to the vertical connection structure 110. The redistribution pattern 132L may extend from one side of the redistribution pad 132P along the upper surface of the base molding layer (the lower molding layer 130b) and may be electrically connected to the vertical connection structure 110 through a backside via 133 penetrating through the base molding layer (the lower molding layer) 130b.

The redistribution substrate 140 may include an insulating layer 141, a first redistribution layer 142 disposed on the insulating layer 141, and a redistribution via 143 electrically connecting the first redistribution layer 142 and the under-bump metal 160 or the vertical connection structure 110 to each other through the insulating layer 141. The redistribution substrate 140 may redistribute a connection electrode 120P of the semiconductor chip 120 and may physically and/or electrically connect the connection electrodes 120P to an external entity through a connection bump 170. The number of insulating layers 141, the first redistribution layers 142, and the redistribution vias 143 may be more or less than those illustrated in the drawing.

The insulating layer 141 may include an insulating material. For example, a photoimageable dielectric (PID) may be used as the insulating material. In such embodiments, a fine pitch may be implemented through a photo via. Boundaries between the insulating layers 141 may be readily apparent or may not be readily apparent.

The first redistribution layer 142 may redistribute the connection pad 120P of the semiconductor chip 120 to electrically connect the vertical connection structure 110 and the connection bumps 170 to each other. The first redistribution layer 142 may be copper (Cu), aluminum (Al), silver (Ag), tin (Sn), gold (Au), nickel (Ni), lead (Pb), titanium (Ti), or alloys thereof. The redistribution layer 142 may perform various functions depending on a design thereof. For example, the first redistribution layer 142 may have a ground (GND) pattern, a power (PWR) pattern, and/or a signal (S) pattern, and the like. The ground (GND) pattern and the power (PWR) pattern may be the same. In addition, the first redistribution layer 142 may include a redistribution via pad and a connection bump pad. The first redistribution layer 142 may be formed by a plating process and may include a seed layer and a conductor layer.

The redistribution via 143 may electrically connect the first redistribution layers 142, formed on different layers, to each other and may also connect the connection electrode 120P of the semiconductor chip 120 and the vertical connection structure 110 to the first redistribution layer 142. The redistribution via 143 may be in physical contact with the connection electrode 120P when the semiconductor chip 120 is a bare die. The redistribution via 143 is copper (Cu), aluminum (Al), silver (Ag), tin (Sn), gold (Au), nickel (Ni), lead (Pb), titanium (Ti), or alloys thereof. The redistribution via 143 may have a via for signal, a via for power, a via for grounding, and the like, and the via for power and the via for grounding may be the same. The redistribution via 143 may be a field type via filled with a metal material, or may be a conformal type via in which a metal material is formed along a wall surface of a via hole. The redistribution via 143 may be formed by a plating process and may include a seed layer and a conductor layer.

The electrical connection structure 185 (or the backside electrical connection structure) may include an electrical connection pad 182, disposed on an upper surface of the second molding member 130b and electrically connected to the second redistribution layer 132, and an electrical connection via 183 formed below the electrical connection pad 182 and connecting the electrical connection pad 182 and the redistribution pad 132P to each other through the second molding member 130b. Several tens to several tens of thousands of electrical connection structures 185 may be provided. A plurality of vertical connection structures 110 may be spaced apart from a side surface of the semiconductor chip 120 on the redistribution substrate 140 to border and/or surround the semiconductor chip 120. The connection structures 185 may be disposed in a region bordered and/or surrounded by the plurality of vertical connection structures 110. In such embodiments, the plurality of backside electrical connection structures 185 may not be disposed in a central portion of the region bordered and/or surrounded by the plurality of vertical connection structures 110.

The electrical connection pad 182 and the electrical connection via 183 may be integrated with each other and, in some embodiments, may comprise a monolithic structure. Thus, the electrical connection structure 185 may be disposed on the second molding member 130b and may have a pad portion 182, protruding from an upper surface of the second molding member 130b, and a via portion 183 disposed to be in physical contact with the redistribution pad 132P through the second molding member 130b. The pad portion 182 of the electrical connection structure 185 may have a width D2 greater than a width D1 of the redistribution pad 132P.

The electrical connection structure 185 includes seed layers 182a and 183a formed along a surface of the second molding member 130b and a surface of the redistribution pad 132P, conductive layers 182b and 183b formed on the seed layers 182a and 183a, and contact layers 182c formed on the conductive layers 182b and 183b. The conductor layers 182b and 183b may include a body layer 182b, extending along the upper surface of the second molding member 130b in a horizontal direction, and a via body layer 183b extending toward the redistribution pad 132P through the second molding member 130b. The seed layers 182a and 183a may include copper (Cu) and may be formed by electroless plating. The conductor layers 182b and 183b may include nickel (Ni) and may be formed by electroplating. The contact layer 182c may include gold (Au) and may be formed by electroplating. The seed layers 182a and 183a, the conductor layers 182b and 183b, and the contact layer 182c may have a thickness of about 0.8 µm, a thickness of about 5 µm, and a thickness of about 0.5 respectively. In the electrical connection structure 185, a Ni/Au layer formed on a surface of a Cu pad for solder bonding (a pad included in the second redistribution layer) as a barrier layer and a diffusion barrier layer may be separated into an additional conductive structure to reduce a size of the Cu pad and to increase integration density of a Cu pattern on a package backside.

The second passivation layer 181 may have an opening 181h disposed on the second molding member 130b to expose at least a portion of the electrical connection pad 182. A width D3 of the electrical connection pad 182, exposed through the second passivation layer 181, may have a size meeting a predetermined standard. The width D3 of an exposed surface of the electrical connection pad 182, exposed through the opening 181h of the second passivation layer 181, may be greater than the width D1 of the redistribution pad 132P. The second passivation layer 181 is configured to protect the electrical connection structure 185 from physical and chemical damage. The second passivation layer 181 may include a thermosetting resin. For example, the second passivation layer 189 may be an ABF, but embodiments are not limited thereto. Several tens to several tens of thousands of openings 181h may be provided.

In a typical POP, a backside connection pad for POP, which may be formed on a backside of a lower package, may be designed to have a predetermined size. A surface treatment layer (Ni/Au) for bonding to a solder is formed on a surface of the backside connection pad for POP. In this case, when the number of backside connection pads for POP is increased, a space for forming a backside interconnection line is restricted and there may be a technical limitation in decreasing a width of the backside interconnection line. Therefore, it may be difficult to implement a plurality of backside connection pads used for POP bonding of a high-performance semiconductor chip.

Conversely, the semiconductor package 100A according to some example embodiments, may include a backside electrical connection structure 185 for bonding to a solder. The backside electrical connection structure 185 includes conductor layers 182b and 183b, including nickel (Ni), and contact layers 182c disposed on upper surfaces of the conductor layers 182b and 183b and including gold (Au). The second redistribution layer 132 or the redistribution pad 132P, including copper (Cu), may be disposed below the backside electrical connection structure 185 in the cross-sectional view of FIG. 1. A pad portion 182 of the backside electrical connection structure 185 may have a width D2 greater than the width D1 of the redistribution pad 132P. Accordingly, the redistribution pattern 132L electrically connected to the redistribution pad 132P may be formed more densely without a spatial limitation caused by an increase in the number of the backside electrical connection structures 185 to which the solder is bonded for POP bonding.

For example, the redistribution pad 132P may include a first backside redistribution pad 132P-1 and a second backside redistribution pad 132P-2 disposed adjacent to each other. The electrical connection pad 182 may include a first electrical connection pad 182-1, disposed above the first backside redistribution pad 132P-1, and a second electrical connection pad 182-2 disposed above the second backside redistribution pad 132P-2 as shown in the plan view of FIG. 2. The redistribution pattern 132L may include redistribution patterns 132L penetrating between the first backside redistribution pad 132P-1 and the second backside redistribution pad 132P-2 to connect the vertical connection structure 110 and other redistribution pads 132P to each other. At least a portion of the plurality of redistribution patterns may vertically overlap at least one of the first electrical connection pad 182-1 and the second electrical connection pad 182-2 in a cross sectional view of the semiconductor package 100A.

A distance W1 between the first electrical connection pad 182-1 and the second electrical connection pad 182-2 may be less than a distance W2 between the first backside redistribution pad 132P-1 and the second backside redistribution pad 132P-2.

The first passivation layer 150 is a configured to protect the redistribution substrate 140 from physical and chemical damage. The first passivation layer 150 may include a thermosetting resin. For example, the first passivation layer 150 may be an ABF, but embodiments thereof are not limited thereto. The first passivation layer 150 may have an opening formed to expose at least a portion of a lowermost first redistribution layer 142 among the first redistribution layers 142. The openings may be provided in an amount of several tens to several tens of thousands, or may be provided in an amount of several tens to several thousands or more or several tens to several thousands or less. Each of the openings may have a plurality of holes.

The underbump metal 160 may improve connection reliability of the connection bumps 170 and may improve board level reliability of the semiconductor package 100A. The underbump metals 160 may be provided in an amount of several tens or several tens of thousands, or an amount of several tens to several thousands or more or several tens to several thousands or less. Each of the underbump metals 160 may be formed in the opening of the first passivation layer 150 to be electrically connected to an exposed lowermost first redistribution layer 142. The underbump metal 160 may be formed by a metallization method using a metal, but embodiments of a method of forming the underbump metal 160 are not limited thereto.

The connection bumps 170 are configured to physically and/or electrically connect the semiconductor package 100A to an external entity. For example, the semiconductor package 100A may be mounted on a mainboard of an electronic device through the connection bumps 170. The connection bumps 170 may be disposed on the first passivation layer 150 and may be electrically connected to the underbump metals 160, respectively. The connection bumps 170 may be formed of a metal having a low melting point, for example, tin (Sn) or an alloy including tin (Sn). The connection bump 170 may include a solder, but a material thereof is not necessarily limited in accordance with various embodiments of the inventive concept.

The connection bumps 170 may be embodied as a land, a ball, a pin, or the like. The connection bumps 170 may be formed to have a multilayer structure or a single-layer structure. When the electrical connection bumps 170 are formed to have a multilayer structure, the electrical connection bumps 170 may include a copper pillar and a solder. When the electrical connection metal is formed to have a single-layer structure, the electrical connection bumps 170 may include a tin-silver solder or copper. However, example embodiments thereof are not limited thereto. The number, an interval, a disposition form, and the like, of the electrical connection bumps 170 are not necessarily limited, but may be sufficiently modified based on design particulars, in accordance with various embodiments of the inventive concept, by a person of skill in the art.

At least one of the connection bumps 170 may be disposed in a fan-out region. The fan-out region may refer to a region outside of a region in which the semiconductor chip 120 is disposed. The fan-out package may have improved reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a relatively small thickness, and may be economically advantageous.

Figure 3:
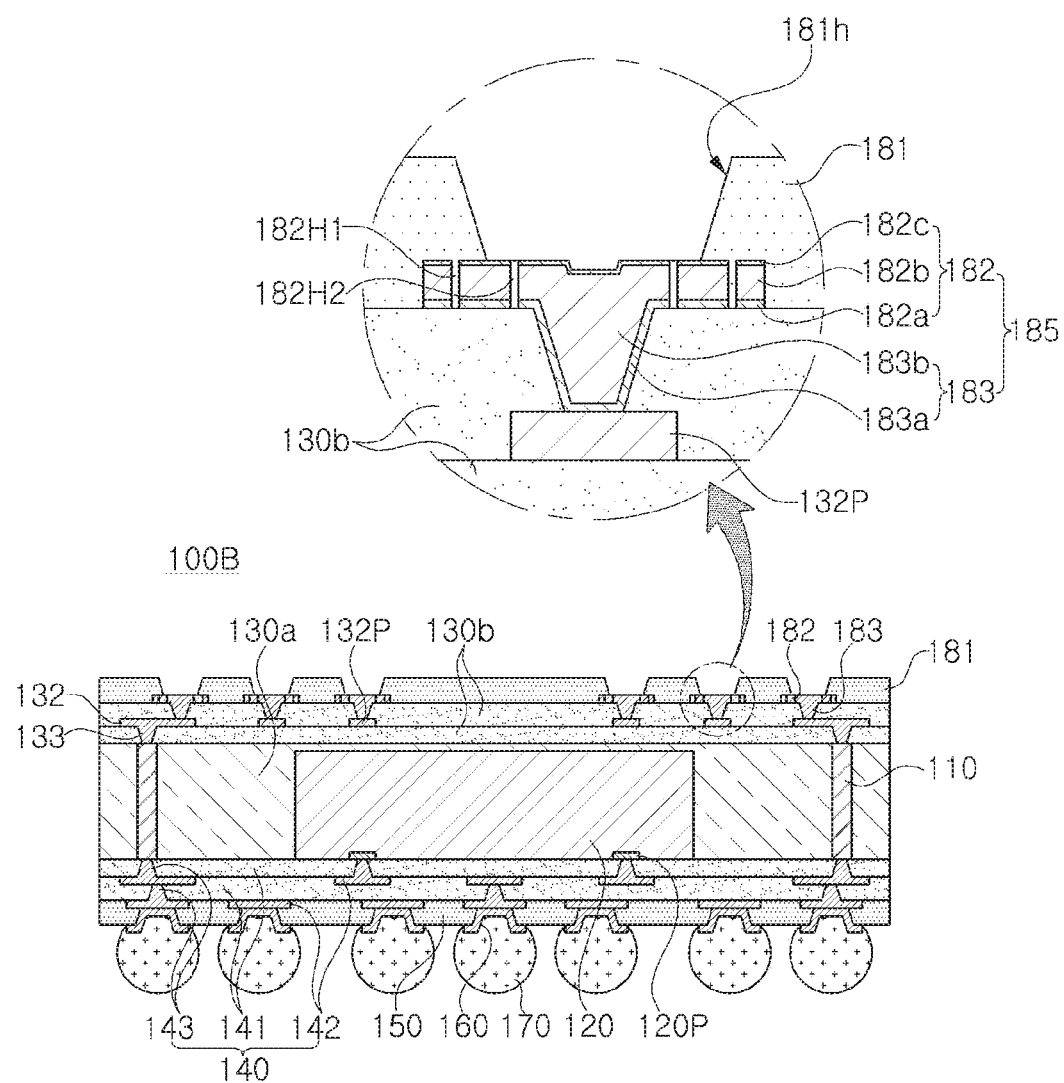
FIG. 3 is a cross-sectional view of a semiconductor package according to further example embodiments of the inventive concept.

FIG. 3 is a cross-sectional view of a semiconductor package 100B according to further example embodiments of the inventive concept, and FIGS. 4A to 6B are schematic plan views illustrating various examples of elements in the semiconductor package of FIG. 3.

Referring to FIG. 3 and FIGS. 4A to 6B, the semiconductor package 100B may have a first groove 182H1 and/or a second groove 182H2 penetrating through an electrical connection pad 182 of a backside electrical connection structure 185. The first groove 182H1 and the second groove 182H2 may be formed through patterning in a plating process of the electrical connection pad 182 or may be formed by removing a portion of the electrical connection pad 182.

Figure 4A:
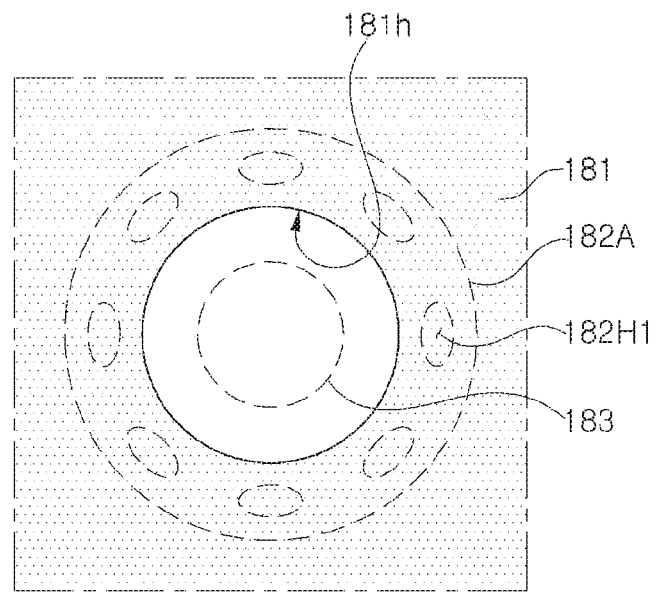
FIGS. 4A to 6B are schematic plan views illustrating various examples of elements in the semiconductor package of FIG. 3.
Figure 4B:
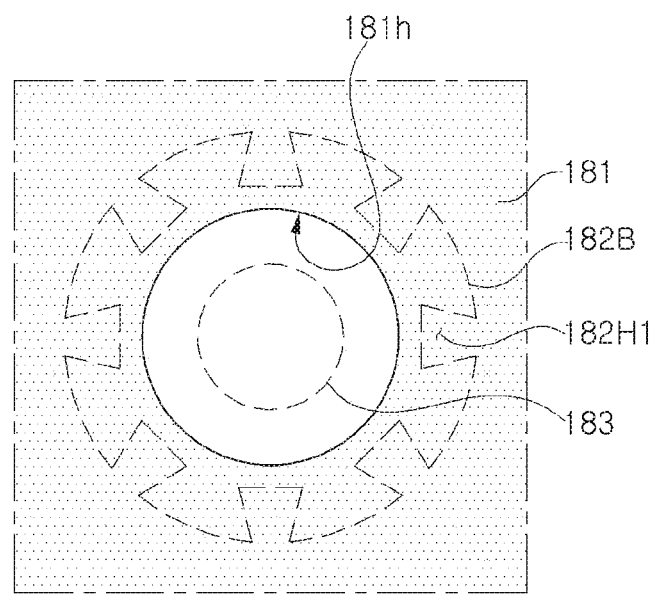

FIGS. 4A and 4B illustrate electrical connection pads 182A and 182B having first holes 182H1 each having an example configuration. The first holes 182H1 may be formed in external regions of the electrical connection pads 182A and 182B. The external region is covered with a second passivation layer 181. The first holes 182H1 penetrate through at least one of the contact layer 182c, the conductor layer 182b, and the seed layer 182a constituting the electrical connection pad 182. Each of the first holes 182H1 may have a hollow shape in which internal walls are continuously connected when viewed from above, i.e., a plan view (FIG. 4A), or may have a shape in which one side of an inner wall may be opened (FIG. 4B). The first holes 182H1 may be at least partially filled with the second passivation layer 181. Thus, adhesion and bonding of the second passivation layer 181 may be improved and reliability of a package may be improved.

Figure 5:
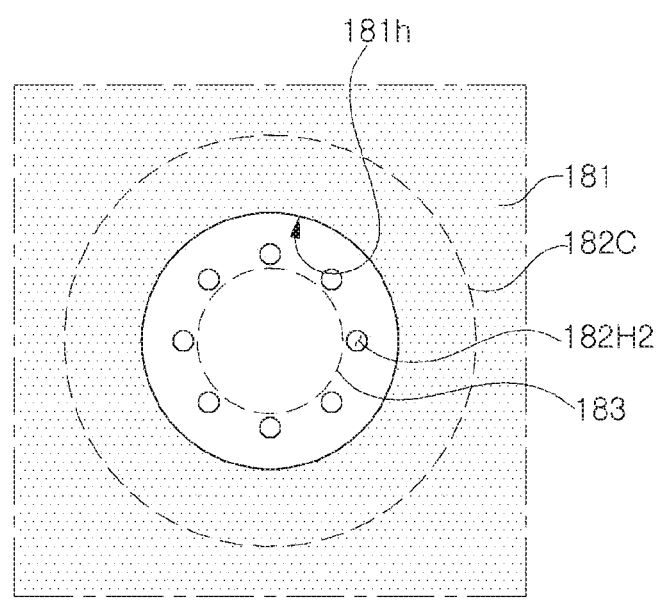

FIG. 5 illustrates an electrical connection pad 182C having second holes 182H2 each having an example configuration. The second holes 182H2 may be formed in an internal region of the electrical connection pad 182C. The internal region is a region that is not covered with the second passivation layer 181 and is exposed, and is an internal region of an opening 181h. The second holes 182H2 may penetrate through at least one of a contact layer 182c, a conductor layer 182b, and a seed layer 182a constituting the electrical connection pad 182. The second holes 182HC may penetrate through all of the contact layer 182c, the conductor layer 182b, and the seed layer 182a to expose a portion of the second molding member 130b. In such embodiments, the second holes 182HC may serve as degassing holes to increase adhesive strength to the second molding member 130b. The second holes 182H2 may have a hollow shape in which internal walls are continuously connected when viewed from above, i.e., a plan view, or at least a portion of hollows may be continuously connected. The second holes 182H2 may be at least partially filled with a solder during POP bonding to improve bonding of the solder and reliability of the package.

Figure 6A:
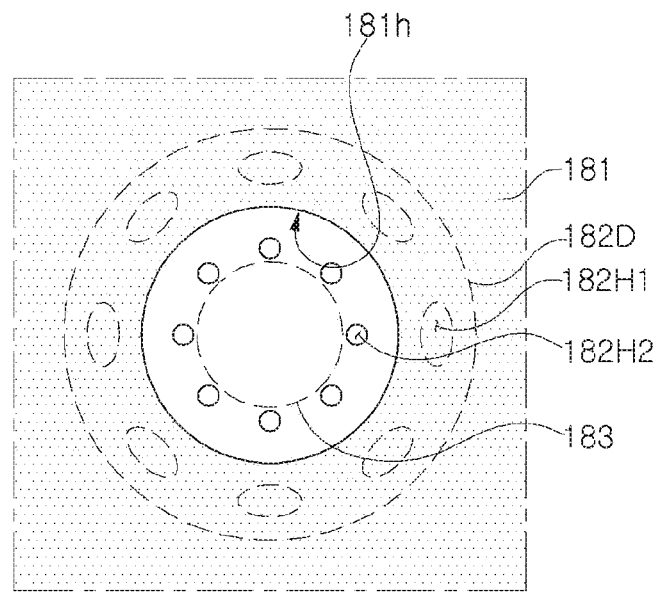
Figure 6B:
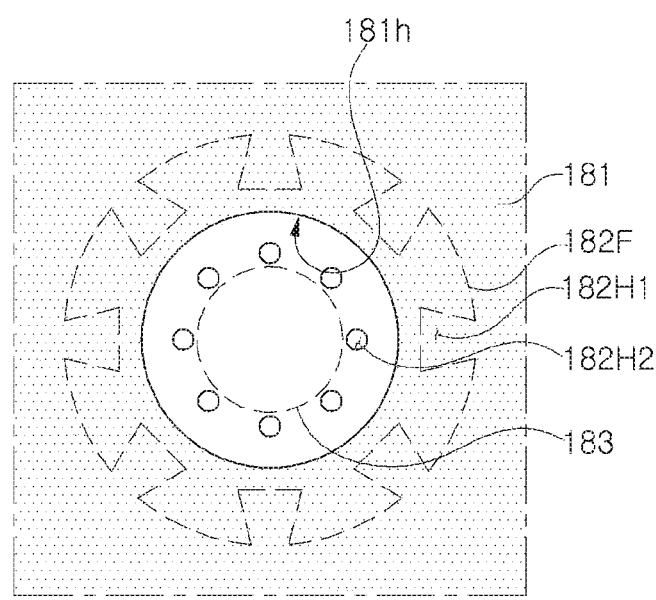

FIGS. 6A and 6B illustrate electrical connection pads 182D and 182F having first holes 182H1 and second holes 182H2 each having an example configuration. The first holes 182H1 may be at least partially covered with a second passivation layer 181, and the second holes 182H2 may be exposed from the second passivation layer 181. The second holes 182H2 may be formed in a position, not overlapping an electrical connection via 183, when viewed from above, i.e., a plan view.

Other elements illustrated in FIG. 3 and FIGS. 4A to 6B are similar to those illustrated in FIG. 1, and thus, detailed descriptions thereof will be omitted.

Figure 7:
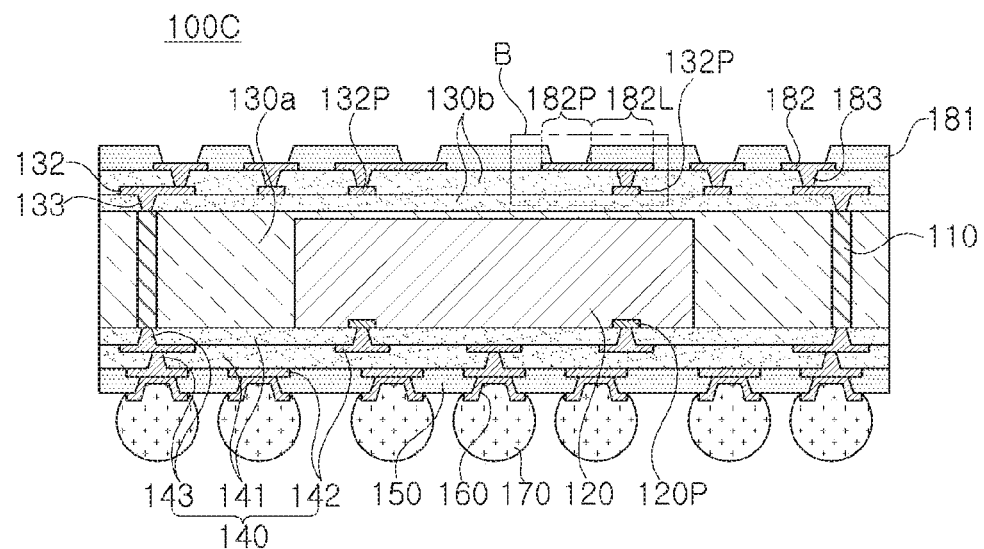
FIG. 7 is a cross-sectional view of a semiconductor package according to further example embodiments of the inventive concept.
Figure 8:
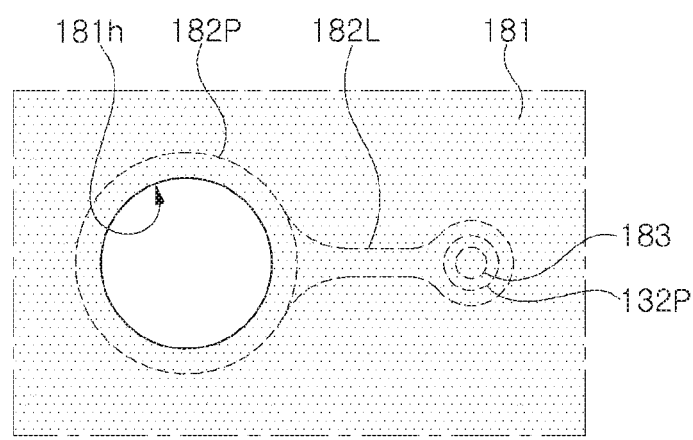
FIG. 8 is a schematic plan view, illustrating elements corresponding to region "B" in the semiconductor package of FIG. 7.

FIG. 7 is a cross-sectional view of a semiconductor package 100C according to further example embodiments of the inventive concept, and FIG. 8 is a schematic plan view, illustrating elements corresponding to region "B" in the semiconductor package of FIG. 7. FIG. 8 illustrates a portion corresponding to region "B" when the semiconductor package 100C of FIG. 7 is viewed from above, i.e., a plan view.

Referring to FIGS. 7 and 8, the semiconductor package 100C may be disposed on an upper surface of a second molding member 130b and may further include an electrical connection pattern 182L extending from an electrical connection pad 182P8. The electrical connection pattern 182L may be connected to a redistribution pad 132P by an electrical connection via 183 penetrating through a second molding member 130b. Accordingly, the electrical connection pad 182P may be disposed to be offset from the redistribution pad 132P. Because an arrangement region of the electrical connection pad 182P may be extended and selected using the electrical connection pattern 182L, the degree of freedom of design may be increased and a greater number of electrical connection pads 182P may be formed.

The electrical connection pattern 182L may be disposed on the second molding member 130b to provide an electrical circuit on the backside of the package 100C. The electrical connection pattern 182L may include a conductive material. For example, the conductive material may be copper (Cu), aluminum (Al), silver (Ag), tin (Sn), gold (Au), nickel (Ni), lead (Pb), titanium (Ti), or alloys thereof. The second electrical connection pattern 182L may perform various functions depending on a design thereof. For example, the second electrical connection pattern 182L may include a ground (GND) pattern, a power (PWR) pattern, and/or a signal (S) pattern. The electrical connection pattern 182L may be formed by a plating process, and may include a seed layer and a conductor layer. The electrical connection pattern 182L may be a circuit pattern extending along an upper surface of the second molding member 130b and having one end, connected to the electrical connection pad 182P, and the other end connected to an electrical connection via 183 penetrating through the second molding member 130b. The electrical connection pattern 182L may extend from an upper surface of the second molding member 130b in a horizontal direction as shown in the cross-sectional and plan view of FIGS. 7 and 8, and may be bent in first and second directions, different from each other, when viewed from above, i.e., the plan view of FIG. 8.

The electrical connection pad 182P has a portion exposed by an opening 181h of the second passivation layer 181 and provides a connection portion of an upper package of a POP structure. The electrical connection pad 182P may be a circular pad having a diameter larger than a linewidth of the electrical connection pattern 182L. However, a shape of the electrical connection pad 182P is not necessarily limited to that shown in FIG. 8 in accordance with various embodiments of the inventive concept.

Among the elements illustrated in FIGS. 7 and 8, elements designated by the same reference numerals as those in FIG. 1 are similar to elements illustrated in FIG. 1, and thus, descriptions thereof will be omitted.

Figure 9:
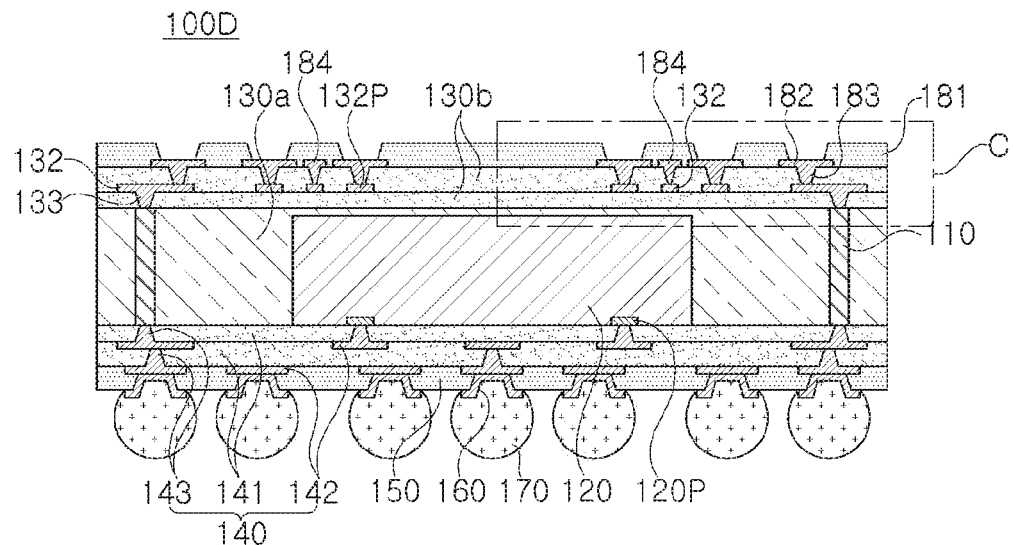
FIG. 9 is a cross-sectional view of a semiconductor package according to further example embodiments of the inventive concept.
Figure 10:
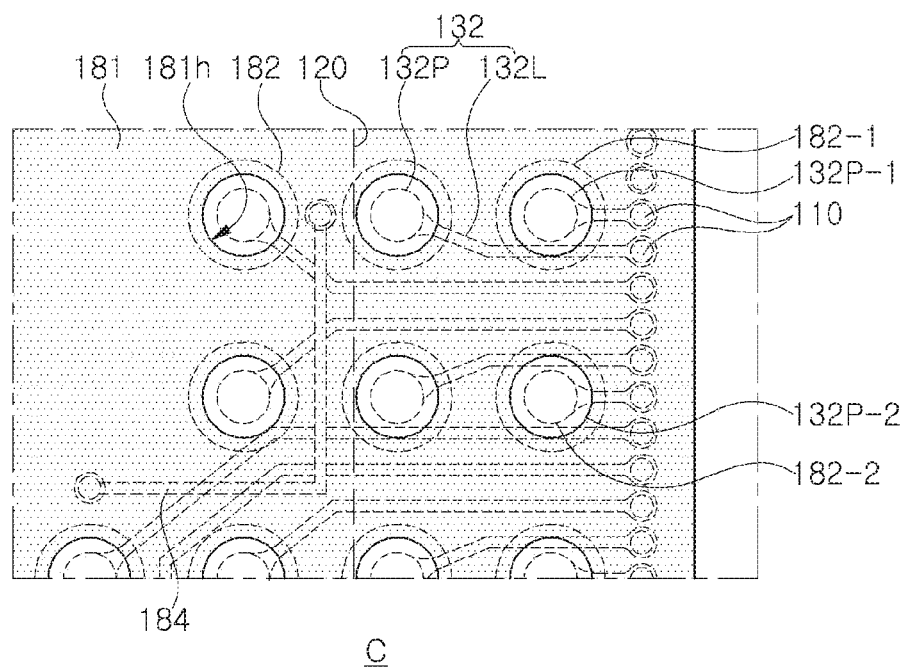
FIG. 10 is a schematic plan view illustrating elements corresponding to region "C" in the semiconductor package of FIG. 9.

FIG. 9 is a cross-sectional view of a semiconductor package 100D according to further example embodiments of the inventive concept, and FIG. 10 is a schematic plan view illustrating elements corresponding to region "C" in the semiconductor package of FIG. 9. FIG. 10 illustrates a portion corresponding to region "C" when the semiconductor package 100D of FIG. 9 is viewed from above, i.e., a plan view.

Referring to FIGS. 9 and 10, the semiconductor package 100D may include a bypass wiring layer 184 disposed on the same level as the electrical connection pad 182 and electrically connecting a plurality of second redistribution layers 132 spaced apart from each other. The bypass wiring layer 184 may be physically spaced apart from the electrical connection pad 182. Unlike the electrical connection pad 182 having a portion exposed by an opening 181h, the bypass wiring layer 184 may, in some embodiments, be completely covered with a second passivation layer 181. A density issue of the second redistribution layer 132 may be addressed using the bypass wiring layer 184.

The bypass wiring layer 184 may overlap a plurality of redistribution patterns 132L in the cross-sectional view of FIG. 9 and may extend across a plurality of redistribution pads 132P, when viewed from above, i.e., the plan view of FIG. 10. The bypass wiring layer 184 may be disposed on the second molding member 130b to provide an electrical circuit to a backside of the package 100D. The bypass wiring layer 184 may include a conductive material. For example, the conductive material may be copper (Cu), aluminum (Al), silver (Ag), tin (Sn), gold (Au), nickel (Ni), lead (Pb), titanium (Ti), or alloys thereof. The bypass wiring layer 184 may perform various functions depending on a design thereof. For example, the bypass wiring layer 184 may have a ground (GND) pattern, a power (PWR) pattern, and/or a signal (S) pattern. The bypass wiring layer 184 may be formed by a plating process, and may include a seed layer and a conductor layer.

Among the elements illustrated in FIGS. 9 and 10, elements designated by the same reference numerals as those in FIG. 1 are similar to elements illustrated in FIG. 1, and thus, descriptions thereof will be omitted.

Figure 11A:
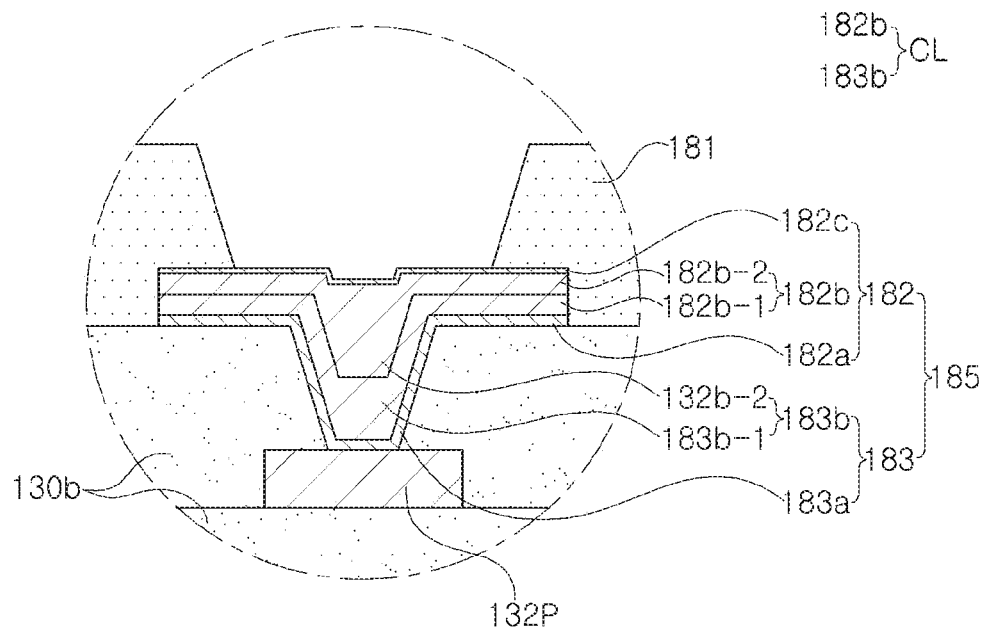
FIGS. 11A and 11B are schematic cross-sectional views illustrating elements of a semiconductor package according to some embodiments of the inventive concept.
Figure 11B:
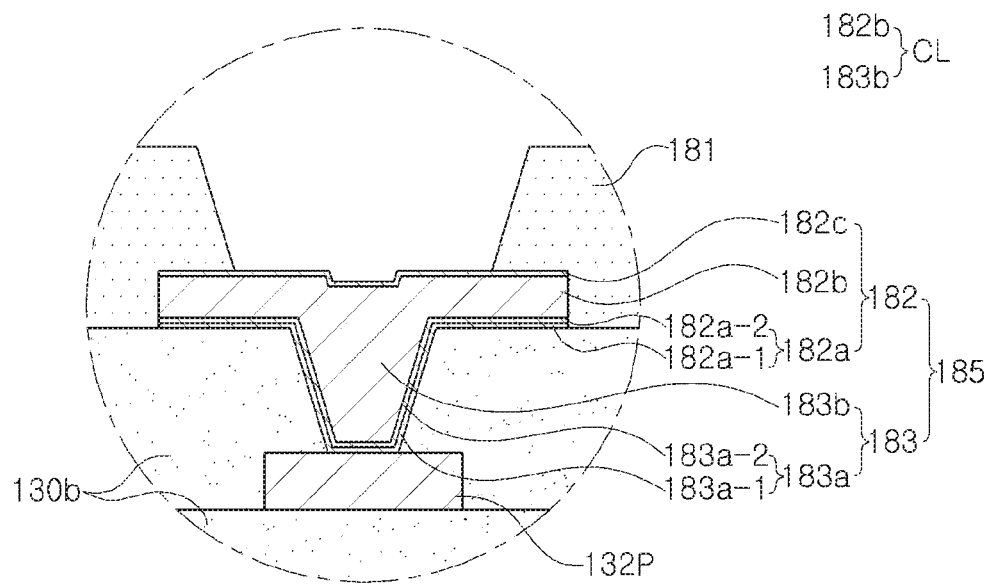

FIGS. 11A and 11B are schematic cross-sectional views illustrating elements of a semiconductor package. FIGS. 11A and 11B illustrate a schematic configuration of an electrical connection structure 185 according to some example embodiments of the inventive concept.

Referring to FIGS. 11A and 11B, the electrical connection structure 185 may include seed layers 182a and 183a, a conductor layer CL, and a contact layer 182c.

In FIG. 11A, the conductor layer CL may include body layers 182b-1 and 182b-2, extending on a second molding member 130b in a horizontal direction, and via body layers 183b-1 and 183b-2 extending toward a redistribution pad 132P. The conductor layer CL may include lower metal layers 182b-1 and 183b-1 and upper metal layers 182b-2 and 183b-2 including different metal materials with respect to each other. For example, the lower metal layers 182b-1 and 183b-1 may include copper, and the upper metal layers 182b-2 and 183b-2 may include nickel. The conductor layer CL may be formed by electroplating. The lower metal layers 182b-1 and 183b-1 and the upper metal layers 182b-2 and 183b-2 may each have a thickness of about 5 μm.

In FIG. 11B, the seed layers 182a and 183a may be continuously formed along a lower surface of the conductor layer CL. The seed layer 183c may include a lower seed layer 183a-1 and an upper seed layer 183a-2, which may include different metal materials with respect to each other. For example, the lower seed layer 183a-1 may include titanium (Ti) or a titanium-tungsten (Ti—W) alloy, and the upper seed layer 183a-2 may include copper. The seed layer 183c may be formed by electroless plating or sputtering. The lower seed layer 183a-1 may have a thickness of about 0.1 µm, and the upper seed layer 183a-2 may have a thickness of about 0.3 µm.

The contact layer 182c may be formed on an upper surface of the conductor layer CL. The contact layer 182c may include a metal material different from that of the conductor layer CL and the seed layers 182a and 183a. For example, the contact layer 182c may include gold (Au) and may be formed by electroplating. The contact layer 182c may be in direct physical contact with a solder during POP bonding. The contact layer 182c may have a thickness of about 0.5 µm.

Among the elements illustrated in FIGS. 11A and 11B, elements designated by the same reference numerals as those in FIG. 1 are similar to elements illustrated in FIG. 1, and thus, descriptions thereof will be omitted.

Figure 12:
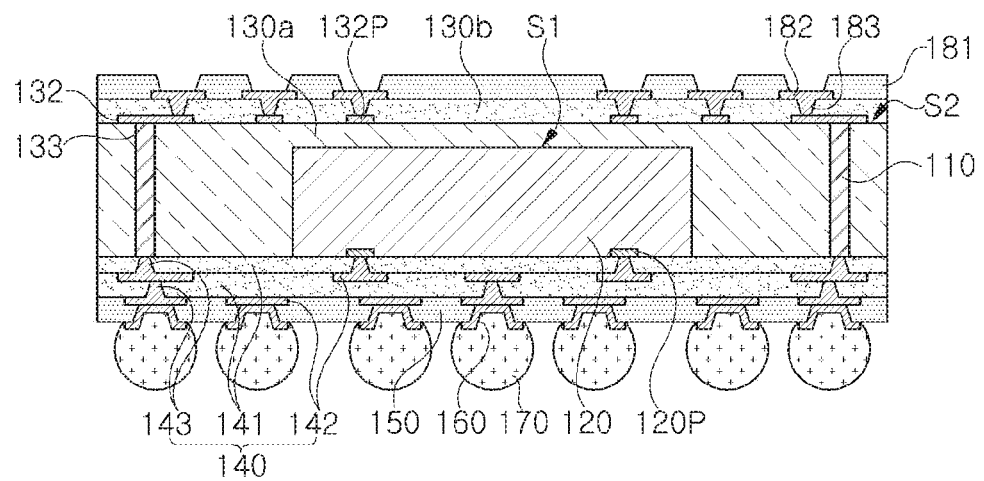
FIG. 12 is a cross-sectional view of a semiconductor package according to further example embodiments of the inventive concept.

FIG. 12 is a cross-sectional view of a semiconductor package 100E according to further example embodiments of the inventive concept.

Referring to FIG. 12, in the semiconductor package 100E, a second redistribution layer 132 may be directly disposed on an upper surface of a first molding member 130a, and a vertical connection structure 110 exposed from the upper surface of the first molding member 130a may be directly connected to a second redistribution layer 132. An upper surface of the vertical connection structure 110 may be disposed on a second surface S2, and a second molding member 130b may be disposed on an upper surface of the first molding member 130a. A first surface 51, an upper surface of a semiconductor chip 120, and the second surface S2 may be spaced apart from each other. Unlike what is illustrated in FIG. 12, in another example embodiment, the first surface 51 and the second surface S2 may be disposed on the same surface.

The above-described structure, according to some embodiments of the inventive concept, may be implemented by molding the vertical connection structure 110 and the semiconductor chip 120 with the first molding member 130a and removing the upper surface of the first molding member 130a using a polishing process to expose an upper surface of the vertical connection structure 110. In the polishing process, even an upper surface of the semiconductor chip 120 may be exposed to allow the first surface 51 and the second surface S2 to be coplanar with each other. In such embodiments, a portion of the semiconductor chip 120 may be removed. Accordingly, a connection distance between the first redistribution layer 142 and the second redistribution layer 132 may be significantly reduced to improve electrical characteristics of the package 100E.

Among the elements illustrated in FIG. 12, elements designated by the same reference numerals as those in FIG. 1 are similar to elements illustrated in FIG. 1, and thus, descriptions thereof will be omitted.

Figure 13:
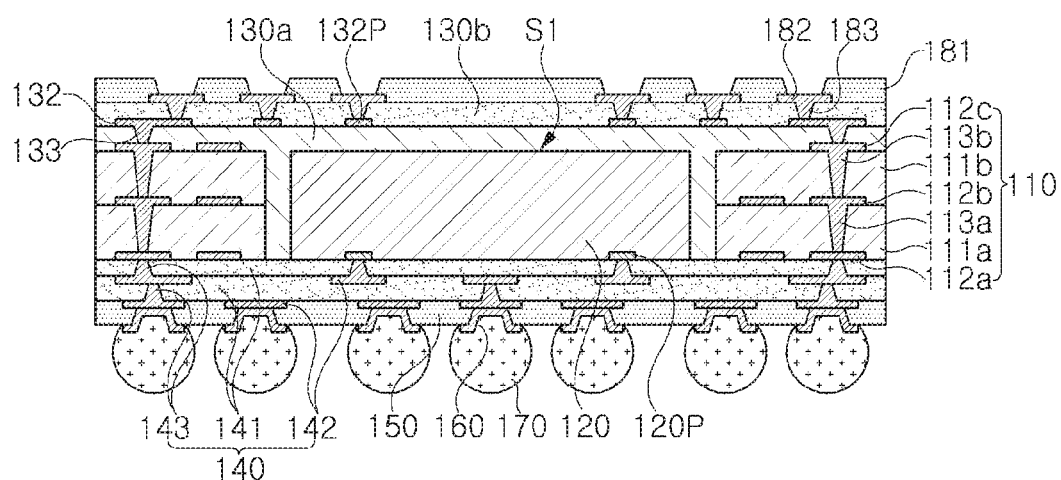
FIG. 13 is a cross-sectional view of a semiconductor package according to further example embodiments of the inventive concept.

FIG. 13 is a cross-sectional view of a semiconductor package 100F according to further example embodiments of the inventive concept.

Referring to FIG. 13, in the semiconductor package 100F, a vertical connection structure 110 may include a first insulating layer 111a disposed to be in physical contact with a redistribution substrate 140, a first wiring layer 112a disposed to be in physical contact with the redistribution substrate 140 and embedded in the first insulating layer 111a, a second wiring layer 112b disposed on a side opposing a side of the first insulating layer 111a in which the first wiring layer 112a is embedded, a second insulating layer 111b disposed on the first insulating layer 111a and at least partially covering the second wiring layer 112b, and a third wiring layer 112c disposed on a side opposing a side of the second insulating layer 111b in which the second wiring layer 112b is embedded. The first wiring layer 112a and the second wiring layer 112b may be electrically connected to each other by a first wiring via 113a penetrating through the first insulating layer 111a, and the second wiring layer 112b and the third wiring layer 112c may be electrically connected to each other by a second wiring via 113b penetrating through the second insulating layer 111b. In addition, the first to third wiring layers 112a, 112b, and 112c may be electrically connected to the first redistribution layer 142 of the redistribution substrate 140.

The vertical connection structure 110 may further improve rigidity of the package 100F according to specific materials of the insulating layers 111a and 111b, and may secure thickness uniformity of the first molding member 130a. The vertical connection structure 110 may have a through-hole 110H penetrating through the insulating layers 111a and 111b. The semiconductor chip 120 may be disposed in the through-hole 110H. The through-hole 110H may have a shape in which a wall surface borders and/or surrounds the semiconductor chip 120, but a shape of the through-hole 110H is not limited thereto in accordance with various embodiments of the inventive concept.

A material of the insulating layers 111a and 111b is not necessarily limited in accordance with various embodiments of the inventive concept. For example, the material of the insulating layers 111a and 111b may be an insulating material. In this case, the insulating material may be a thermosetting resin, such as an epoxy resin, and/or a thermoplastic resin, such as Ajinomoto Build-up Film (ABF). In other embodiments, the insulating material may be an insulating material in which the thermosetting resin or the thermoplastic resin is impregnated together with an inorganic filler in a core material, such as a glass fiber (or a glass cloth or a glass fabric), for example, prepreg.

The wiring layers 112a, 112b, and 112c may provide upper/lower electrical connection paths of the package together with wiring vias 113a and 113b, and may serve to redistribute a connection electrodes 120P. The wiring layers 112a, 112b, and 112c include copper (Cu), aluminum (Al), silver (Ag), tin (Sn), gold (Au), nickel (Ni), lead (Pb), titanium (Ti), or alloys thereof. The wiring layers 112a, 112b, and 112c may have a ground (GND) pattern, a power (PWR) pattern, and/or a signal (S) pattern depending on designs of corresponding layers. The wiring layers 112a, 112b, and 112c may include various signals, for example, a data signal, and the like, except for the ground (GND) pattern, the power (PWR) pattern, and the like. The ground GND pattern and the power PWR pattern may be the same. In addition, each of the wiring layers 112a, 112b, and 112c may include various types of via pads. The wiring layers 112a, 112b, and 112c may be formed by a known plating process, and may each include a seed layer and a conductor layer.

The wiring vias 113a and 113b may electrically connect wiring layers 112a, 112b, and 112c, formed on different layers, to each other. As a result, an electrical path may be formed in the vertical connection structure 110. The wiring vias 113a and 113b may include copper (Cu), aluminum (Al), silver (Ag), tin (Sn), gold (Au), nickel (Ni), lead (Pb), titanium (Ti), or alloys thereof. Each of the wiring vias 113a and 113b may have a via for signal, a via for power, and/or a via for grounding, and the like, and the via for power and the via for grounding may be the same. Each of the wiring vias 113a and 113b may be a field type via at least partially filled with a metal material, or may be a conformal type via in which a metal material is formed along a wall surface of a via hole. The wiring vias 113a and 113b may be formed by a plating process and may include a seed layer and a conductor layer.

Among the elements illustrated in FIG. 13, elements designated by the same reference numerals as those in FIG. 1 are similar to elements illustrated in FIG. 1, and thus, descriptions thereof will be omitted.

Figure 14:
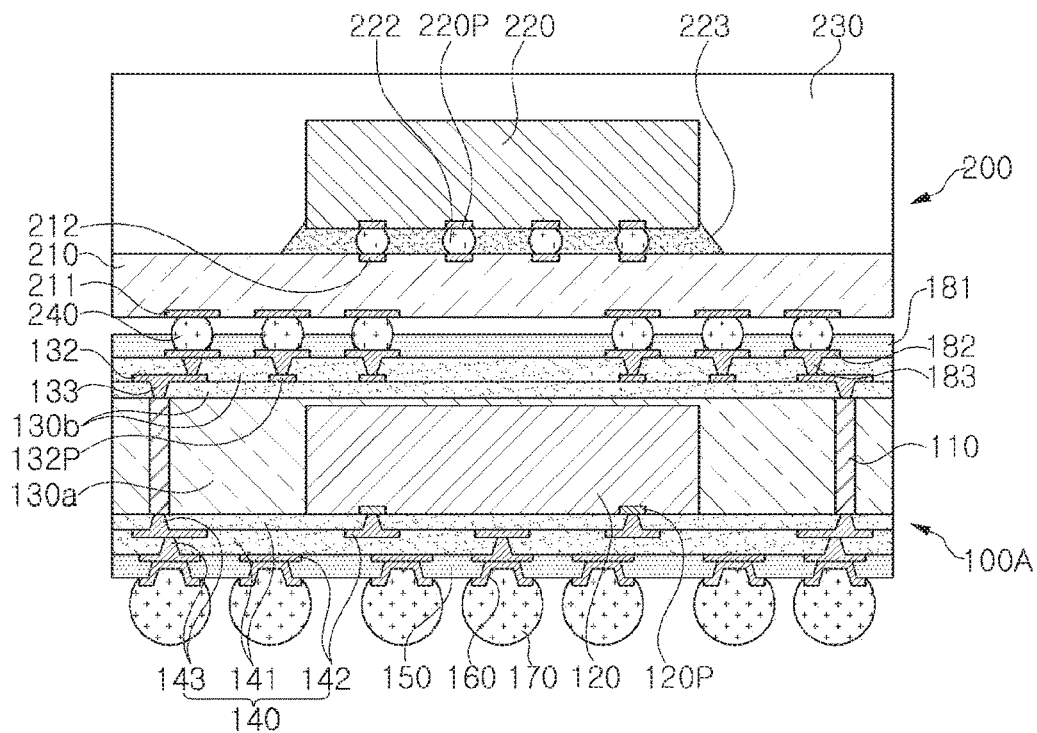
FIG. 14 is a cross-sectional view of a package-on-package structure according to some example embodiments of the inventive concept.

FIG. 14 is a cross-sectional view of a package-on-package structure 300A according to further example embodiments of the inventive concept.

Referring to FIG. 14, the package-on-package structure 300A may include a second package 200 combined with the semiconductor package 100A of FIG. 1. The second package 200 may include a second redistribution substrate 210, a second semiconductor chip 220, and an encapsulant 230.

The second redistribution substrate 210 may include redistribution pads 211 and 212, respectively disposed on an upper surface and a lower surface thereof. Each of the redistribution pads 211 and 212 may be electrically connected to an external entity. In addition, the second redistribution substrate 210 may have redistribution patterns disposed therein configured to connection to the redistribution pads 211 and 212. The redistribution patterns may redistribute a second connection electrode 220P of the second semiconductor chip 220 to a fan-out region.

The second semiconductor chip 220 may include the second connection electrode 220P, and the second connection electrode 220P may be electrically connected to the second redistribution substrate 210 by a metal bump 222. As an example, the second package 200 may further include an underfill material 223 bordering and/or surrounding the metal bump 222. The underfill material 223 may be an insulating material including an epoxy resin, or the like. The metal bump 222 may include a solder ball or a copper pillar.

In other example embodiments, the second connection electrode 220P of the second semiconductor chip 220 may be in direct physical contact with an upper surface of the second redistribution substrate 210 and may be electrically connected to the redistribution patterns through a via in the second redistribution substrate 210.

The encapsulant 230 may include a material identical or similar to a material of the first and second molding members 130a and 130b of the semiconductor package 100A.

The second package 200 may be physically/electrically connected to the semiconductor package 100A by a second connection bump 240. The second connection bump 240 may be electrically connected to redistribution patterns in the second redistribution substrate 210 through the redistribution pad 211 on a lower surface of the second redistribution substrate 210. In other embodiments, the redistribution patterns may be electrically connected to each other through an underbump metal disposed on the redistribution pad 241 on the lower surface of the second redistribution substrate 210. Each of the second connection bumps 240 may be formed of a metal having a relatively low melting point, for example, tin (Sn) or an alloy including tin (Sn). More specifically, each of the second connection bumps 240 may be formed of a solder (solder) or the like. However, the material thereof is not necessarily limited thereto in accordance with various example embodiments of the inventive concept.

Among the elements illustrated in FIG. 14, elements designated by the same reference numerals as those in FIG. 1 are similar to elements illustrated in FIG. 1, and thus, descriptions thereof will be omitted.

Figure 15:
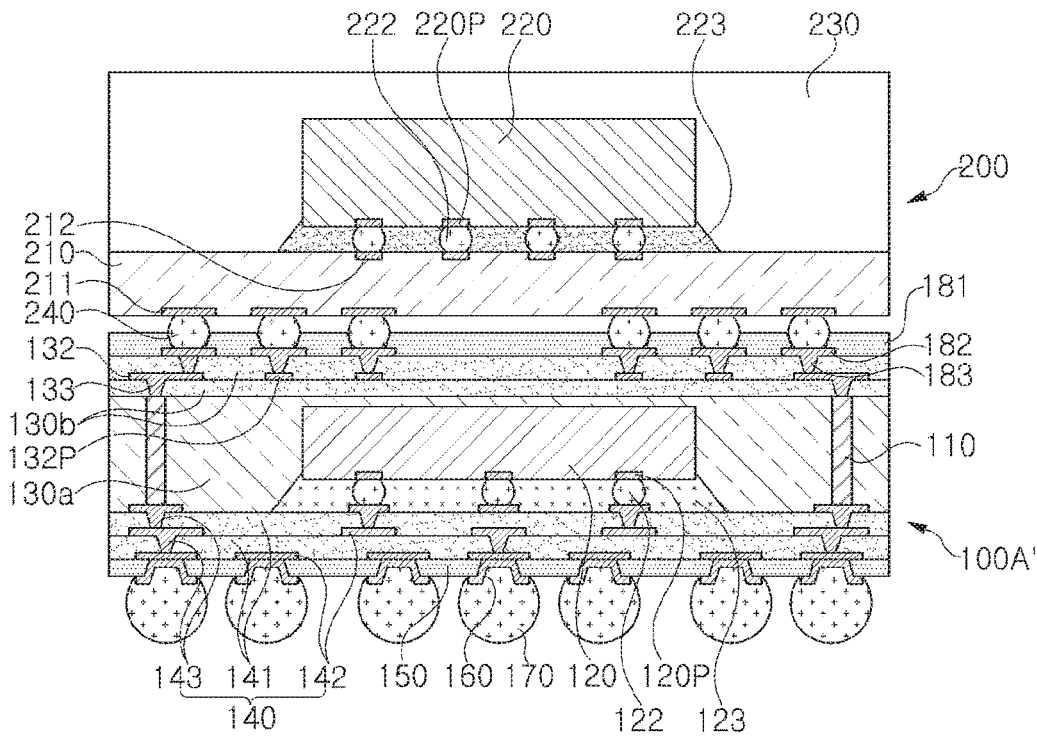
FIG. 15 is a cross-sectional view of a package-on-package structure according to further example embodiments of the inventive concept.

FIG. 15 is a cross-sectional view of a package-on-package structure 300B according to further example embodiments of the inventive concept.

Referring to FIG. 15, unlike the package-on-package structure 300A of FIG. 14, the package-on-package structure 300B includes a redistribution substrate 140 on which a first semiconductor chip 120 of a semiconductor package 100A' may be mounted in a flip-chip manner. The first semiconductor chip 120 may be electrically connected to a redistribution layer 142 of the redistribution substrate 140 by a metal bump 122. An underfill material 123 may be disposed below the first semiconductor chip 120 to border and/or surround the metal bump 122. The underfill material 123 may be an insulating material including an epoxy resin, or the like. The metal bump 122 may include a solder ball or a copper pillar.

Among the elements illustrated in FIG. 15, elements designated by the same reference numerals as those in FIGS. 1 and 14 are similar to elements illustrated in FIGS. 1 and 14, and thus, descriptions thereof will be omitted.

Figure 16:
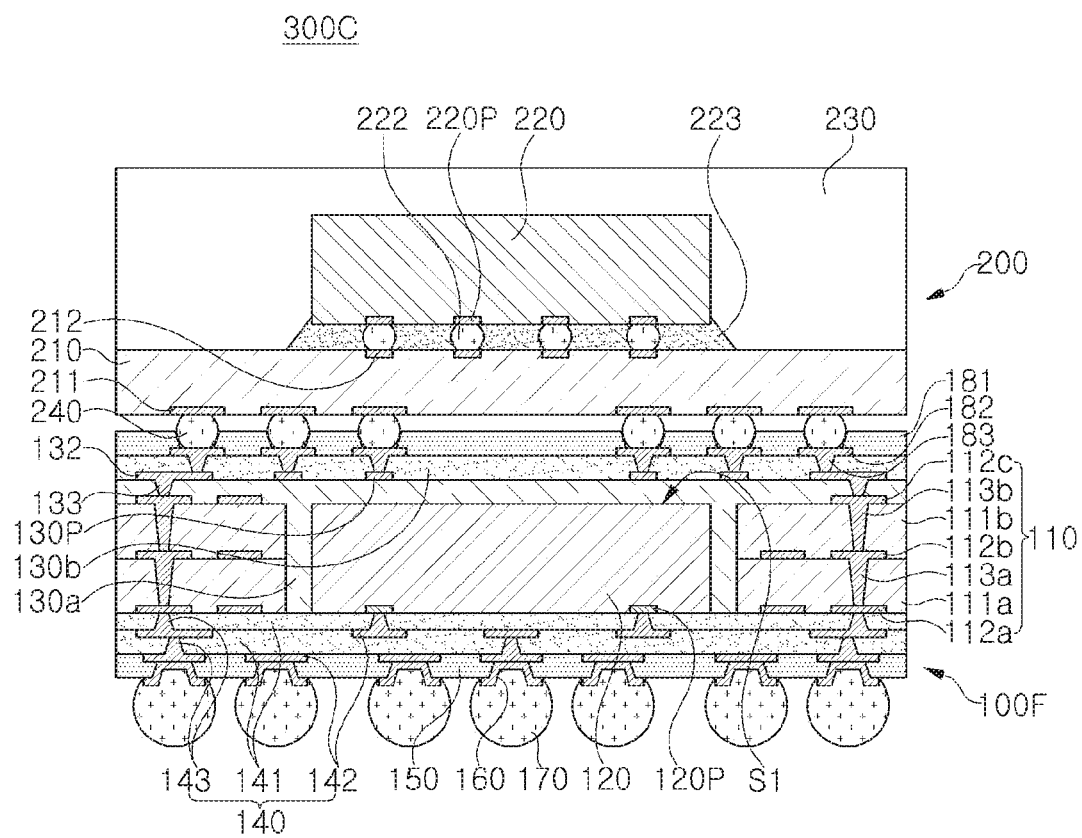
FIG. 16 is a cross-sectional view of a package-on-package structure according to further example embodiments of the inventive concept.

FIG. 16 is a cross-sectional view of a package-on-package structure 300C according to further example embodiments of the inventive concept.

Referring to FIG. 16, the package-on-package structure 300C may include a second package 200 combined with the semiconductor package 100F of FIG. 13. Among the elements illustrated in FIG. 16, elements designated by the same reference numerals as those in FIGS. 1 and 14 are similar to elements illustrated in FIGS. 1 and 14, and thus, descriptions thereof will be omitted.

As described above, an electrical connection pad and a second redistribution layer may be separated from each other to provide a semiconductor package having improved integration density of the second redistribution layer and improved reliability.

While example embodiments have been shown and described above, it will be apparent to those skilled in the art that modifications and variations could be made without departing from the scope of the present inventive concept as defined by the appended claims.

What is claimed is:

1. A semiconductor package comprising:
    a redistribution substrate including a first redistribution layer;
    a semiconductor chip on the redistribution substrate and electrically connected to the first redistribution layer;
    a first molding member on the redistribution substrate and directly on the semiconductor chip;
    a second redistribution layer on the first molding member and having a redistribution pad;
    a vertical connection structure between the redistribution substrate and the second redistribution layer and electrically connecting the first redistribution layer and the second redistribution layer to each other;
    a second molding member on the first molding member and at least a portion of the second redistribution layer;
    an electrical connection pad on an uppermost surface of the second molding member and electrically connected to the second redistribution layer; and
    a passivation layer on the second molding member and having an opening exposing at least a portion of the electrical connection pad,
    wherein the electrical connection pad includes a conductor layer, including a first metal, and a contact layer on the conductor layer and including a second metal,
    wherein the redistribution pad includes a third metal, different from the first metal and the second metal, wherein the portion of the electrical connection pad, exposed by the opening, has a width greater than a width of the redistribution pad, and wherein the vertical connection structure extends through the first molding member.

2. The semiconductor package of claim 1, wherein the second molding member includes a base molding layer, on an upper surface of the first molding member, and a build-up molding layer on an upper surface of the base molding layer, wherein the redistribution pad of the second redistribution layer is on an upper surface of the base molding layer and the build-up molding layer is on a portion of the redistribution pad, wherein the electrical connection pad is on an upper surface of the build-up molding layer, wherein the second redistribution layer extends from one side of the redistribution pad along the upper surface of the base molding layer and has a redistribution pattern electrically connected to the vertical connection structure through a backside via extending through the base molding layer, wherein the redistribution pad includes a first backside redistribution pad and a second backside redistribution pad that are adjacent to each other, wherein the electrical connection pad includes a first electrical connection pad above the first backside redistribution pad, and a second electrical connection pad above the second backside redistribution pad in a cross-sectional view of the semiconductor package in which the redistribution substrate serves as a base reference plane, wherein the redistribution pattern includes a plurality of redistribution patterns extending between the first backside redistribution pad and the second backside redistribution pad, and wherein at least a portion of the plurality of redistribution patterns vertically overlap at least one of the first electrical connection pad and the second electrical connection pad in the cross-sectional view of the semiconductor package.

3. The semiconductor package of claim 2, wherein a distance between the first electrical connection pad and the second electrical connection pad is less than a distance between the first backside redistribution pad and the second backside redistribution pad.

4. The semiconductor package of claim 1, wherein the electrical connection pad has an external region in which a plurality of first grooves are formed that extend through the contact layer and the conductor layer, wherein the passivation layer is on the electrical connection pad.

5. The semiconductor package of claim 4, wherein the electrical connection pad has an internal region in which a plurality of second grooves are formed that extends through the contact layer and the conductor layer, wherein the internal region of the electrical connection pad is free of the passivation layer.

6. The semiconductor package of claim 1, further comprising:

an electrical connection pattern on the uppermost surface of the second molding member and extending from the electrical connection pad, wherein the electrical connection pattern is connected to the redistribution pad by an electrical connection via that extends through the second molding member, and wherein the electrical connection pad is offset from the redistribution pad.

7. The semiconductor package of claim 1, wherein the second redistribution layer includes a plurality of second redistribution layers spaced apart from each other, wherein a bypass wiring layer is on a same level as the electrical connection pad and electrically connects the plurality of second redistribution layers to each other, and wherein the bypass wiring layer is spaced apart from the electrical connection pad.

8. The semiconductor package of claim 7, wherein the passivation layer is on an upper surface of the bypass wiring layer.

9. The semiconductor package of claim 1, further comprising:

an electrical connection via formed below the electrical connection pad in a cross-sectional view of the semiconductor package in which the redistribution substrate serves as a base reference plane and electrically connecting the electrical connection pad and the redistribution pad to each other through the second molding member, wherein the conductor layer includes a body layer extending on the second molding member in a vertical direction in the cross-sectional view, and a via body layer extending through the second molding member and toward the redistribution pad.

10. The semiconductor package of claim 9, wherein the conductor layer includes a lower metal layer, including copper, and an upper metal layer on the lower metal layer and including nickel.

11. The semiconductor package of claim 9, comprising:

a seed layer extending continuously along a lower surface of the conductor layer.

12. The semiconductor package of claim 11, wherein the seed layer includes a lower seed layer, including titanium, and an upper seed layer on the lower seed layer and including copper.

13. The semiconductor package of claim 1, wherein the vertical connection structure includes a first insulating layer in physical contact with the redistribution substrate, a first wiring layer in physical contact with the redistribution substrate and embedded in the first insulating layer, a second wiring layer on a side opposing a side of the first insulating layer in which the first wiring layer is embedded, a second insulating layer on the first insulating layer and the second wiring layer, and a third wiring layer on a side opposing a side of the second insulating layer in which the second wiring layer is embedded, and wherein the first, second, and third wiring layers are electrically connected to the first redistribution layer.

14. A semiconductor package comprising:

a redistribution substrate including a first redistribution layer;

a semiconductor chip on the redistribution substrate;

a first molding member on the redistribution substrate and the semiconductor chip;

a second redistribution layer on the first molding member and including a redistribution pad;

a vertical connection structure on the redistribution substrate and electrically connecting the first redistribution layer and the second redistribution layer to each other;

a second molding member directly on the first molding member and on at least a portion of the second redistribution layer, such that the portion of the second redistribution layer is between the second molding member and the redistribution substrate; and an electrical connection structure on the second molding member and electrically connected to the redistribution pad, wherein the electrical connection structure includes a conductor layer, including nickel (Ni), and a contact layer on an upper surface of the conductor layer and including gold (Au), and wherein the redistribution pad includes copper (Cu).

15. The semiconductor package of claim 14, wherein the electrical connection structure has a pad portion, protruding from an uppermost surface of the second molding member, and a via portion in physical contact with the redistribution pad through the second molding member.

16. The semiconductor package of claim 15, wherein the pad portion of the electrical connection structure has a width greater than a width of the redistribution pad.

17. A semiconductor package comprising:
a redistribution substrate including a first redistribution layer;
a semiconductor chip on the redistribution substrate and electrically connected to the first redistribution layer;
a first molding member on the redistribution substrate and directly on at least an upper surface of the semiconductor chip, such that the semiconductor chip is between the first molding member and the redistribution substrate;
a plurality of vertical connection structures embedded in the first molding member and electrically connected to the first redistribution layer;
a second molding member including a base molding layer on an upper surface of the first molding member, and a build-up molding layer on an upper surface of the base molding layer;
a second redistribution layer on the upper surface of the base molding layer and including a plurality of redistribution pads and a plurality of redistribution patterns electrically connecting the plurality of redistribution pads and the plurality of vertical connection structures to each other; and
a plurality of electrical connection structures on the second molding member and having a pad portion, protruding from the upper surface of the build-up molding layer, and a via portion in physical contact with at least one of the plurality of redistribution pads through the build-up molding layer, wherein the plurality of electrical connection structures include a conductor layer, including nickel (Ni), and a contact layer on an upper surface of the conductor layer and including gold (Au), wherein the plurality of redistribution pads include a first backside redistribution pad and a second backside redistribution pad adjacent to each other, wherein the plurality of electrical connection structures include a first backside electrical connection structure and a second backside electrical connection structure corresponding to the first backside redistribution pad and the second backside redistribution pad, respectively, and wherein the plurality of redistribution patterns extend between the first backside redistribution pad and the second backside redistribution pad, and at least a portion of the plurality of redistribution patterns vertically overlaps at least one of the first backside electrical connection structure and the second backside electrical connection structure in a cross-sectional view of the semiconductor package in which the redistribution substrate serves as a base reference plane.

18. The semiconductor package of claim 17, wherein the plurality of vertical connection structures border the semiconductor chip on the redistribution substrate, and
wherein the plurality of electrical connection structures are in a region bordered by the plurality of vertical connection structures.

19. The semiconductor package of claim 18, wherein the plurality of electrical connection structures are outside of a central portion of the region bordered by the plurality of vertical connection structures.

* * * * *